United States Patent [19]
Yew et al.

[11] Patent Number: 6,013,555
[45] Date of Patent: Jan. 11, 2000

[54] PROCESS FOR ROUNDING AN INTERSECTION BETWEEN AN HSG-SI GRAIN AND A POLYSILICON LAYER

[75] Inventors: Tri-Rung Yew, Hsin-Chu; Water Lur, Taipei; Shih-Wei Sun, Taipei, all of Taiwan; Chung-Shien Kao, deceased, late of Taipei, Taiwan, by Mei-Man Chen, legal representative

[73] Assignee: United Microelectronics Corp., Taiwan

[21] Appl. No.: 08/807,960

[22] Filed: Feb. 28, 1997

Related U.S. Application Data

[60] Provisional application No. 60/024,945, Aug. 30, 1996.

[51] Int. Cl.$^7$ ................................................ H01L 21/8242
[52] U.S. Cl. ......................... 438/398; 438/396; 438/255; 438/253; 438/964
[58] Field of Search ..................................... 257/309, 317; 438/255, 398, 964, 253, 396

[56] References Cited

U.S. PATENT DOCUMENTS

| | | | |
|---|---|---|---|
| 5,037,773 | 8/1991 | Lee et al. | 438/398 |
| 5,149,676 | 9/1992 | Kim et al. | 438/398 |
| 5,244,842 | 9/1993 | Cathey et al. | 438/398 |
| 5,474,950 | 12/1995 | Kim | 438/398 |
| 5,597,754 | 1/1997 | Lou et al. | 438/398 |
| 5,700,710 | 12/1997 | Zenke | 438/398 |
| 5,811,344 | 9/1998 | Tu et al. | 438/398 |
| 5,885,882 | 3/1999 | Schugraf et al. | 438/398 |

OTHER PUBLICATIONS

H. Watanabe, et al. entitled, "Device Application and Structure Observation for Hemispherical–Grained Si," J. Appl. Physics, vol. 71, No. 7, Apr. 1992, pp. 3538–3543.

P. Fazan, et al. entitled, "Electrical Characterization of Textured Interpoly Capacitors for Advanced Stacked DRAMs," IEDM, IEEE 1990, pp. 663–666.

M. Sakao, et al. entitled, "A Capacitor–Over–Bit–Line (COB) Cell with a Hemispherical–Grain Storage Node for 64Mb DRAMs," IEDM, IEEE 1990, pp. 655–658.

Rosato, et al., "Ultra–High Capacitance Nitride Films Utilizing Surface Passivation on Rugged Polysilicon," J. Electochem. Soc., vol. 139, No. 12, Dec. 1992, pp. 3678–3682.

*Primary Examiner*—Carl Whitehead, Jr.
*Assistant Examiner*—Toniae M. Thomas
*Attorney, Agent, or Firm*—Rabin & Champagne, P.C.

[57] ABSTRACT

The capacitor of a DRAM cell is formed by depositing a layer of doped polysilicon, patterning the layer of doped polysilicon to define the extent of the capacitor's lower electrode and depositing a layer of hemispherical-grained silicon (HSG-Si) on the layer of doped polysilicon. A thin layer of amorphous silicon is then formed over the HSG-Si layer. This textured polysilicon structure forms the lower electrode of the DRAM capacitor. A dielectric layer is formed on the lower electrode, and an upper electrode is formed from a second layer of doped polysilicon. As-formed HSG-Si grains tend to form sharp intersections with the polysilicon layers on which they grow. When these HSG-Si grains are exposed to a thermal oxidation environment, poor quality oxides are formed at the sharp corners between the HSG-Si grains and the doped polysilicon layer. The poor quality oxides at the sharp corners between the HSG-Si grains and the doped polysilicon layer break down comparatively readily, and appears to cause leakage currents in capacitors having HSG-Si electrodes. By growing a thin amorphous silicon layer over the surface of the HSG-Si layer, the intersection between the HSG-Si grains and the layer of polysilicon is rounded. Subsequent growth of a thermal oxide, or the formation of other dielectric layers, provides a more reliable capacitor.

18 Claims, 1 Drawing Sheet

PROCESS FOR ROUNDING AN INTERSECTION BETWEEN AN HSG-SI GRAIN AND A POLYSILICON LAYER

This application claims priority from provisional application Ser. No. 60/024,945 filed Aug. 30, 1996.

BACKGROUND OF THE INVENTION

1. Field of the Invention

The present invention relates to the formation of high capacitance structures in integrated circuit devices and, more particularly, to the formation of electrodes which incorporate at least one textured surface.

2. Description of the Related Art

Historically, increasing the density of integrated circuit devices has been accomplished in part by decreasing the size of structures such as wiring lines and transistor gates and by decreasing the separation between the structures which make up the integrated circuit device. Reducing the size of circuit structures is generally referred to as decreasing the "design rules" used for the manufacture of the integrated circuit device. For dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one. The surface area of the plates of the memory capacitors determines the amount of charge that can be stored on each of the capacitors, given the typical fixed operating voltage of a memory, the electrode separation that can reliably be manufactured, and the dielectric constant of the capacitor dielectric typically used in the capacitors. Reducing the surface area occupied by such a DRAM capacitor in accordance with reduced design rules tends to reduce the surface area of the capacitor plates and reduce the amount of charge that can be stored on the memory capacitor (i.e., the capacitance).

The amount of charge stored on memory capacitors typically must be large enough to obtain reliable operation of the memory. For recent ultra large scale integration ("ULSI") DRAM designs, further reductions in the amount of charge stored on the DRAM memory capacitors could prevent the information stored on the capacitor from reliably being read out. In addition, because charge inevitably drains from memory capacitors, DRAMs require a periodic refresh of the charge stored on each of the capacitors of the DRAM to ensure that the stored charge remains above the minimum detectable level. Further reductions in capacitance would require more frequent refresh operations for the DRAM, which are undesirable because at least portions of the DRAM are unavailable for the reading and writing of information during refresh operations.

To address the challenges of reduced structure sizes, DRAM designs have been proposed which incorporate capacitors having vertical extensions above the surface of the substrate (i.e., "stacked" capacitors) or below the surface of the substrate (i.e., "trench" capacitors). By adopting a more three-dimensional structure, such DRAM designs provide memory capacitors having larger capacitances but which consume less of the substrate surface area. Although stacked capacitor and trench capacitor designs involve more complicated structures which are more difficult to manufacture, these designs have recently been adopted with at least some success. Alternative, less expensive and more easily manufactured structures providing improved capacitance are desirable. In addition, it is desirable to reduce the vertical extent of the storage capacitor to allow the production of more planar device structures. There additionally remains a need to increase the capacitance of DRAM storage capacitors while decreasing the amount of surface area consumed by the DRAM storage capacitor on the surface of the semiconductor substrate.

One technique that has been proposed for increasing the capacitance obtained for a fixed substrate surface area is to use rugged or textured polysilicon as the bottom plate for the memory capacitor. The advantages of this technique are illustrated in part in FIG. 1, which shows in cross-section a portion of a DRAM having a memory capacitor with a lower plate electrode formed from textured polysilicon. The illustrated DRAM consists of a silicon substrate 10, field oxidation regions 12, source/drain regions 14, 16 and gate electrode 18 of the memory cell's transfer field effect transistor ("FET") and a wiring line 20 formed over one of the field oxide regions 12. The wiring line 20 interconnects portions of the DRAM in the well-known manner and the transfer FET acts as a switch during capacitor read out and write operations. In such a DRAM, the memory capacitor may be connected to a source/drain region 16 of the transfer FET by a vertically extending interconnect 22 which terminates in a plate 24 formed from conventional polysilicon. A layer of textured polysilicon 26 is formed on the upper surface of the conventional polysilicon plate 24 to complete the lower electrode of the charge storage capacitor. A thin dielectric layer 28 covers the surface of both the layer of textured polysilicon 26 and the exposed portions of the plate 24, and a layer of doped polysilicon 30 is formed on the dielectric layer 28 to serve as the upper electrode for the capacitor. By using textured polysilicon within the lower electrode of the capacitor, the surface area of the capacitor is increased without extending the capacitor electrodes laterally, so that the illustrated structure has improved capacitance for a fixed surface area.

A variety of techniques have been used to produce textured polysilicon for use in semiconductor devices like the DRAM illustrated in FIG. 1. Watanabe, et al., "Device Application and Structure Observation for Hemispherical-Grained Si," describes the formation of hemispherical-grained polycrystalline silicon ("HSG-Si", used hereinafter to refer to textured polysilicon) by low pressure chemical vapor deposition (LPCVD) from silane gas ($SiH_4$). The surface roughness or texture of the HSG-Si films was maximized so that the HSG-Si films could be used as plates of DRAM memory capacitors, with maximum capacitances being obtained for polysilicon (HSG-Si) deposited at a substrate temperature of 590° C. Substrate deposition temperatures of ten degrees higher or lower than 590° C. produced an unacceptable surface texture, that is, these conditions produced an undesirably flat surface which did not provide appreciably larger capacitance electrodes than conventional polysilicon. Capacitors made using a lower electrode of HSG-Si deposited using LPCVD onto a substrate at a temperature of 590° C. exhibited a capacitance per unit area approximately two times larger than similar capacitors made using flat lower electrodes deposited at substrate temperatures of either 580° C. or 600° C. (or higher).

Fazan, et al., "Electrical Characterization of Textured Interpoly Capacitors for Advanced Stacked DRAMs," describes an alternative process for forming a textured surface on a layer of doped polycrystalline silicon. Wet oxidation at 907° C. is used to grow an oxide film on the surface of a doped polysilicon layer and then the oxide film is etched to produce a textured surface on the polycrystalline silicon. Etching of the oxide layer grown on the polysilicon layer results in creation of a textured polysilicon surface due to the greater levels of oxidation that occurs along the grain boundaries of doped polysilicon layers coupled with the subsequent removal of the oxide from the polysilicon grain boundaries. The extent of surface roughness produced in this process directly relates to the size of the polysilicon grains, so that small grained films are required to produce desirable levels of surface texture.

The article by Sakao, et al., "A Capacitor-Over-Bit-Line (COB) Cell with a Hemispherical-Grain Storage Node for 64 Mb DRAMs," 1990 IEDM describes the formation of a DRAM capacitor incorporating HSG-Si to provide increased storage capacitance. Formation of the Sakao capacitor proceeds as follows. After the formation of the source, drain and gate of the transfer FET, a layer of oxide is formed over the gate and word line. A contact via is opened to the drain of the transfer FET and a vertical interconnect conductor is formed to extend from the drain to the surface of the layer of oxide. A layer of conventional polysilicon is deposited by LPCVD at 600° C. in contact with the vertical interconnect. The layer of conventional polysilicon is patterned by lithography and reactive ion etching to form a core storage node connected to the drain of the transfer FET through the vertical interconnect.

Hemispherical-grained polysilicon is formed over the surface of the core storage node by LPCVD deposition using silane diluted with helium at one Torr. pressure and a substrate temperature of 550° C. The HSG-Si deposited had a grain size of eighty nanometers and the layer had a thickness of at least eighty nanometers over the conventional polysilicon of the core storage node. The HSG-Si was then etched back by reactive ion etching using HBr as an etch gas to remove the HSG-Si from the surface of the oxide layer adjacent to the core storage node. Etching back also removes the HSG-Si from the surface of the storage node, reproducing the texture of the original HSG-Si surface on the surface of the conventional polysilicon within the core storage node. Thus, the lower electrode of the Sakao DRAM capacitor is conventional polysilicon having a surface structure (texture, roughness) that is substantially the same as HSG-Si having a grain size of eighty nanometers.

The use of HSG-Si within lower electrodes of DRAM capacitors has been successful in approximately doubling the capacitance of DRAM capacitors, but no further improvements in capacitance have been obtained using HSG-Si. A difficulty that has been encountered in the implementation of capacitors incorporating HSG-Si is that excessive leakage currents have been observed for capacitors incorporating HSG-Si electrodes. Because of the incidence of high leakage currents, it has been difficult to use very thin dielectric layers for the capacitor dielectric layers. Use of thicker dielectric layers decreases the capacitance of HSG-Si capacitors, neutralizing the advantage gained through the use of HSG-Si.

SUMMARY OF THE EMBODIMENTS

It is accordingly an object of this invention to provide a method of forming an HSG-Si layer in the process of making an electrode that is more compatible with the use of thin dielectric films on the HSG-Si electrode.

One aspect of the present invention forms a semiconductor device by providing a layer of polysilicon on or above a silicon substrate and then providing a layer of hemispherical-grained silicon on the layer of polysilicon. A layer of amorphous silicon is provided on the layer of hemispherical-grained silicon and on any exposed portions of the layer of polysilicon. A dielectric layer is formed over a surface of the layer of amorphous silicon.

Another aspect of the present invention provides a method of making a semiconductor device comprising the steps of providing a deposition substrate on or above a silicon substrate and providing a layer of hemispherical-grained silicon on the deposition substrate. A layer of conductive material is provided on the layer of hemispherical-grained silicon and on any exposed portions of the deposition substrate, wherein comparatively sharp intersections are formed between grains of the hemispherical-grained silicon and the layer of conductive material and wherein outer surfaces of the layer of conductive material are comparatively smooth adjacent the comparatively sharp intersections. A dielectric layer is then provided over the layer of conductive material.

DESCRIPTION OF THE PREFERRED EMBODIMENTS

Preferred embodiments of the present invention provide a layer of hemispherical-grained polysilicon (HSG-Si) on the surface of a layer of polysilicon and then provide a layer of amorphous silicon over the HSG-Si layer. As-formed HSG-Si grains tend to form sharp intersections with the doped polysilicon layers on which they grow. When these HSG-Si grains are exposed to a thermal oxidation environment, poor quality oxides are formed at the sharp intersections between the HSG-Si grains and the polysilicon layer. The poor quality oxides at the sharp corners between the HSG-Si grains and the polysilicon layer break down and electrically leak comparatively easily, thus causing undesirable leakage currents to flow in capacitors having HSG-Si electrodes. By providing a thin layer of doped amorphous silicon on the surface of the HSG-Si layer, the intersections between the HSG-Si grains and the layer of polysilicon is rounded. Subsequent growth of a thermal oxide, or the formation of other dielectric layers, provides a more reliable capacitor.

Figure 1:
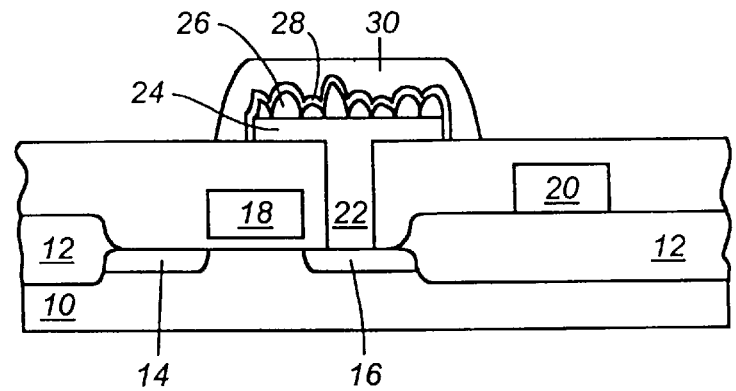
FIG. 1 illustrates in cross-section a portion of a DRAM utilizing a memory capacitor having a lower electrode incorporating a layer of hemispherical-grained silicon.
Figure 2:
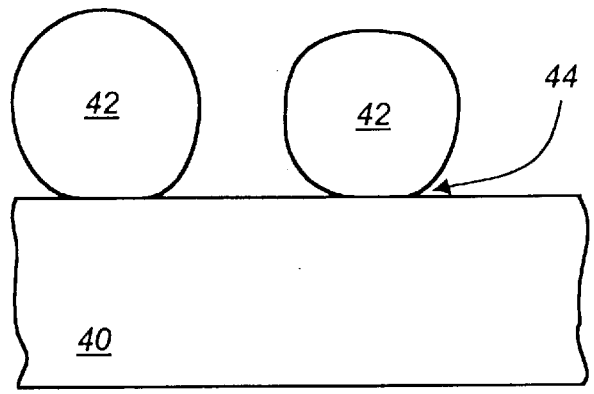
FIG. 2 illustrates an initial stage in forming an HSG-Si electrode in accordance with the present invention.
Figure 3:
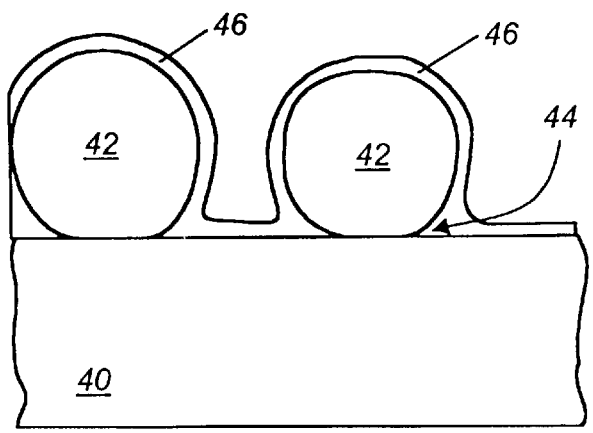
FIG. 3 illustrates a further stage in forming an HSG-Si electrode in accordance with the present invention.

FIGS. 2–3 illustrate aspects of an embodiment of the present invention and illustrate the differences in process and results associated with preferred embodiments of the present invention. These figures are necessarily schematic illustrations of the structures involved, and are exaggerated in several aspects to provide a better understanding. Each of FIGS. 2–3 illustrate a portion of the lower electrode structure for a capacitor which could be substituted for the lower electrode of FIG. 1 made up of lower polysilicon plate 24 and upper HSG-Si layer 26. Referring now to FIG. 2, a layer of conventional polysilicon 40 is deposited by low pressure chemical vapor deposition (LPCVD) at 620° C. from silane (SiI$_4$) onto a layer of silicon oxide (not shown) deposited above a silicon substrate and onto a conductor connected to a source/drain region of a memory transistor. The layer of conventional polysilicon 40 is preferably doped prior to HSG-Si growth, by doping the polysilicon layer in situ during deposition, by ion implantation and annealing, or by a thermal diffusion process, all of which are well known. For example, layer 40 may be highly doped N-type by implantation of phosphorus ions followed by a rapid thermal anneal at a temperature of 1000–1100° C. for about 10–30 seconds. Alternately, the polysilicon layer might not be doped at this time and instead might be doped by subsequent implantation or diffusion procedures. A plate of the conventional polysilicon 40 that will form the core of the lower electrode is defined through photolithography and etching. A layer of HSG-Si will be deposited over this plate of conventional polysilicon 40.

It is preferred that the HSG-Si growth process be initiated on a clean silicon surface by cleaning native oxide from the surface of the polysilicon layer 40 before depositing the HSG-Si. A distinct cleaning step may be unnecessary if the growth of the HSG-Si layer is initiated immediately after forming the underlying layer of silicon, if the surface of the underlying silicon layer is maintained in a sufficient vacuum to prevent oxide growth. More practically, it is to be expected that there will be a time interval between the growth of the underlying silicon layer and the initiation of HSG-Si growth. Also, if the layer of polysilicon is doped by implantation and annealing or by thermal diffusion, a layer of oxide will be grown on the surface of the layer of polysilicon. Accordingly, the surface of the underlying silicon layer is preferably cleaned before the initiation of HSG-Si growth. Native oxides may be cleaned from the surface of polysilicon by a variety of techniques, including HF dip, spin-etching using HF, vapor HF cleaning, or by an $H_2$ plasma cleaning. Preferably, the surface of the underlying silicon layer is hydrogenated as a result of the cleaning operation, because the hydrogenated surface serves to protect the polysilicon surface from reoxidation. Each of the cleaning techniques listed above will achieve the desired hydrogenation of the polysilicon surface.

After cleaning, a layer of HSG-Si is deposited on the surface of the conventional polysilicon layer 40. Deposition of the HSG-Si may be performed in any of the well-known methods for growing HSG-Si, and may consist of depositing HSG-Si by LPCVD from silane source gas onto a substrate held at a temperature of between 570° C. to 585° C. A cross section through a small portion of the resulting structure is shown in FIG. 2, which includes an irregular surface of HSG-Si. Due to the random nature of the nucleation of HSG-Si growth, the HSG-Si grains 42 will typically be sparsely distributed over the polysilicon layer 40 so that the underlying polysilicon layer 40 is exposed between grains of the HSG-Si layer.

The HSG-Si grains have a generally spherical shape and are attached to the planar polysilicon layer 40 at the nucleation sites of HSG-Si growth, with sharp intersections 44 formed at the interfaces between the HSG-Si grains 42 and the polysilicon layer 40. When a surface such as that shown in FIG. 2 is used as an electrode of a charge storage capacitor such as that used in the FIG. 1 DRAM, the capacitor dielectric must cover the surfaces of the HSG-Si grains 42 and the exposed surfaces of the polysilicon layer 40. The sharp intersections 44 between the HSG-Si grains 42 and the polysilicon layer 40 are difficult to cover effectively with a dielectric layer. For example, if a thermal oxide layer is formed either as a dielectric layer on its own or as part of an oxide/nitride/oxide ("ONO") dielectric layer, the oxide formed at the intersections 44 may be of poor quality. That is, the oxide covering such intersections may be prone to electrical break down and undesirable levels of leakage due, at least in part, to the difficult topography of the intersections 44 and likely due to the high level of stress at the intersections 44. Capacitors incorporating dielectric layers having locally poor quality regions at the intersections 44 typically exhibit poor break down and leakage characteristics, requiring that thicker dielectric layers be used over surfaces like that illustrated in FIG. 2 than are used in other modern DRAM capacitor configurations. Use of thicker dielectric layers is undesirable, since thicker dielectric layers reduce the capacitance of the resulting capacitor.

Preferred embodiments of the present invention form a thin layer of conductive material over the surface of HSG-Si grains in a manner which fills in or covers over the sharp intersections 44 between the HSG-Si grains 42 and the surface of the polysilicon layer 40. For example, a layer of doped amorphous silicon 46 may be provided over the surface of the HSG-Si grains in a manner that rounds the sharp intersections 44, as shown in FIG. 3. By providing a smoother topography for the HSG-Si topography, it is easier to provide a uniformly dense and high quality layer of dielectric material over the entire surface of an electrode including HSG-Si. Adding such a thin surface layer of a conductive material over the surface of the HSG-Si electrode also provides a less strained surface for the formation of dielectric layers. This smoother and less strained surface allows the formation of higher quality dielectric layers over the surface of electrodes incorporating an HSG-Si layer. As a direct result of the improved quality of the dielectric layer formed on the surface of the FIG. 3 structure, thinner dielectric layers can be formed in charge storage capacitors incorporating HSG-Si electrodes. Doped amorphous silicon is particularly preferred as the rounded surface layer in the FIG. 3 structure because of the compatibility of the amorphous silicon with conventional processing. In particular, use of an amorphous silicon surface layer allows ready compatibility with state of the art dielectric materials. Possible future developments in this art may, however, utilize other surface layers and dielectric layers compatible with such surface layers.

The size of HSG-Si grains 42 on polysilicon layer 40 is typically on the order of 80–100 nanometers. Particularly preferred embodiments of the present invention form a layer of amorphous silicon that fills the intersections 44 to provide a rounded surface for layer 46 without filling in the texture of the HSG-Si grains. For example, an amorphous silicon layer may be deposited to a thickness of between about 10–40 nanometers, depending on the particular topography of the HSG-Si layer provided on the surface of the polysilicon layer 40. A variety of deposition techniques for amorphous silicon are known. For example, the layer of amorphous silicon 46 might be deposited in the same LPCVD chamber as is used for the deposition of the HSG-Si layer 42 as part of the same deposition sequence, that is, without breaking vacuum and without allowing any oxide growth on the surface of the HSG-Si grains. LPCVD of amorphous silicon can be accomplished on the HSG-Si grains and on the polysilicon layer by lowering the substrate temperature below the temperatures at which HSG-Si can be deposited. For example, a substrate temperature of 500° C. might be used for the growth of the amorphous silicon layer. The amorphous silicon layer may be doped in situ during deposition, by ion implantation and annealing, or by a thermal diffusion process either from the amorphous silicon layer's surface or from the underlying layer of polysilicon, all of which are well known. Because it is preferred that the amorphous silicon layer be formed in the same deposition chamber as is used for HSG-Si deposition, it is preferred that the HSG-Si be doped in the same manner and at the same time as the amorphous silicon layer is doped.

If the amorphous silicon is not grown as a second step in the process used to form the HSG-Si layer, the amorphous silicon might be grown in another deposition system. If the wafers are exposed to atmosphere, if excessive time passes, or if the wafers are moved between deposition systems, it will typically be necessary to clean the surface of the HSG-Si layer prior to amorphous silicon deposition using one of the HF-based cleaning techniques listed above. After the amorphous silicon layer is formed, the polysilicon layer 40, HSG-Si layer 42 and amorphous silicon layer 46 are patterned to form lower electrodes for charge storage capacitors, such as the electrodes 24 shown in FIG. 1.

When the surface of a structure such as that illustrated in FIG. 3 is coated with a thin dielectric layer and an upper layer of conductive material is deposited on the dielectric layer, a high capacitive coupling can be established between the textured polysilicon layer and the upper layer of conductive material. Preferably, a second layer of heavily doped N-type polysilicon is provided, and a capacitor structure like that illustrated in FIG. 1 is formed. For such a structure, it is desirable to use a dielectric layer that is thin in comparison to the scale of the texture on the surface. It is also desirable to form the dielectric layer from a material having a high dielectric constant. An appropriate dielectric layer can be formed by depositing a layer of silicon nitride on the surface of the HSG-Si layer, for example by CVD, and then growing a thin oxide layer on the surface of the silicon nitride layer. Sometimes, such an "NO" layer is formed on top of an oxide layer, such as a native oxide layer, covering the surface of the textured polysilicon layer, so that the actual dielectric film formed has an "ONO" structure. According to Rosato, et al., "Ultra-High Capacitance Nitride Films Utilizing Surface Passivation on Rugged Polysilicon," *J. Electrochem. Soc.*, Vol. 139, No. 12, pages 3678–82 (Dec. 1992), such an "ONO" structure can be formed to a thickness of approximately 4 nanometers. The teachings of the Rosato article, including the teachings regarding the formation of ONO dielectric layers on rugged polysilicon and on the passivation of native oxide surfaces before the deposition of a CVD nitride layer, are hereby incorporated by reference. Alternately, a thin layer of tantalum pentoxide or other high dielectric constant material can be used as a dielectric layer covering the textured polysilicon surface and acting as a capacitor dielectric.

While the method for forming textured polysilicon has been described herein with specific reference to forming a capacitor such as that shown in the DRAM structure of FIG. 1, textured polysilicon in accordance with the present invention can be utilized in other structures. For example, the textured polysilicon might be used on the surface of the floating gate in an EEPROM or a flash memory. Use of a textured polysilicon surface and a thin ONO dielectric layer between a polysilicon floating gate and a polycide control gate formed over the ONO dielectric layer greatly improves the coupling between the floating gate and the control gate as compared to more conventional flash memory device structures.

While the present invention has been described with reference to certain preferred embodiments thereof, it is to be understood that the present invention is not limited to a particular preferred embodiment described herein. Rather, the scope of the present invention is to be determined from the following claims.

What is claimed:

1. A method of making a semiconductor device, comprising the steps of:

providing a layer of polysilicon on or above a silicon substrate;

providing a layer of hemispherical-grained silicon on the layer of polysilicon;

providing a layer of amorphous silicon on the layer of hemispherical-grained silicon and on an exposed portion of the layer of polysilicon; and forming a dielectric layer over a surface of the layer of amorphous silicon.

2. The method of claim 1, wherein the layer of amorphous silicon is thinner than the layer of hemispherical-grained silicon.

3. The method of claim 2, wherein the dielectric layer is formed on the layer of amorphous silicon.

4. The method of claim 1, wherein the layer of amorphous silicon is deposited by chemical vapor deposition at a temperature below about 570° C.

5. The method of claim 4, wherein the layer of hemispherical-grained polysilicon is grown on the layer of doped polysilicon by chemical vapor deposition at a temperature of less than 600° C.

6. The method of claim 1, further comprising the steps of:

forming a second layer of doped polysilicon over the dielectric layer; and patterning the second layer of doped polysilicon to provide an upper electrode of a capacitor.

7. The method of claim 1, wherein the layer of hemispherical-grained polysilicon is deposited at a temperature of between about 570° C. to about 585° C.

8. The method of claim 7, wherein the layer of hemispherical-grained silicon is formed to have a grain size of approximately 100 nanometers or less.

9. The method of claim 8, wherein the amorphous silicon layer is thinner than the layer of hemispherical-grained silicon.

10. A method of making a semiconductor device, comprising:

providing a deposition substrate on or above a silicon substrate;

providing a layer of hemispherical-grained silicon on the deposition substrate;

providing a layer of conductive material on the layer of hemispherical-grained silicon and on an exposed portion of the deposition substrate, wherein intersections are formed between grains of the hemispherical-grained silicon and the deposition substrate and wherein exposed outer surfaces of the layer of conductive material are planar adjacent the intersections; and forming a dielectric layer over the layer of conductive material.

11. The method of claim 10 wherein the layer of conductive material comprises amorphous silicon.

12. The method of claim 10, wherein the dielectric layer is formed to a thickness of about 4 nanometers.

13. The method of claim 1, wherein the dielectric layer is formed to a thickness of about 4 nanometers.

14. The method of claim 1, wherein subsequent to the providing a layer of hemispherical-grained silicon, the layer of polysilicon is exposed between grains of the layer of hemispherical-grained silicon.

15. A method of making a semiconductor device, comprising the steps of:

providing a layer of polysilicon on or above a silicon substrate;

providing a layer of hemispherical-grained silicon on the layer of polysilicon, wherein a plurality of intersections are formed between grains of the hemispherical-grained silicon and the layer of polysilicon;

providing a layer of amorphous silicon on the layer of hemispherical-grained silicon and on an exposed portion of the layer of polysilicon, wherein exposed outer surfaces of the layer of amorphous silicon are planar adjacent to the intersections; and forming a dielectric layer over a surface of the layer of amorphous silicon.

16. The method of claim 15, wherein the layer of amorphous silicon is thinner than the layer of hemispherical-grained silicon.

17. The method of claim 15 wherein the layer of amorphous silicon is deposited by chemical vapor deposition at a temperature below about 570° C.

18. The method of claim 15, wherein the dielectric layer is formed to a thickness of about 4 nanometers.

* * * * *